United States Patent [19]
Schade, Jr.

[11] 3,879,640
[45] Apr. 22, 1975

[54] PROTECTIVE DIODE NETWORK FOR MOS DEVICES

[75] Inventor: Otto Heinrich Schade, Jr., North Caldwell, N.J.

[73] Assignee: RCA Corporation, New York, N.Y.

[22] Filed: Feb. 11, 1974

[21] Appl. No.: 441,050

[52] U.S. Cl. ............... 317/31; 307/304; 317/33 SC; 357/41; 357/13; 357/48; 307/303
[51] Int. Cl. ............... H02h 3/20
[58] Field of Search ............... 317/33 SC, 235 G, 31; 307/303, 304; 357/41, 13, 48

[56] References Cited

UNITED STATES PATENTS 3,434,068 3/1969 Sevin ............... 357/41
3,748,547 7/1973 Sugimoto ............... 357/41
3,806,773 4/1974 Watanabe ............... 357/41

*Primary Examiner*—James D. Trammell
*Attorney, Agent, or Firm*—H. Christoffersen; Henry I. Schanzer

[57] ABSTRACT

A protective diode network for a differential amplifier comprised of insulated gate field effect transistors. The network provides for both gate-to-gate and gate-to-source protection using a small number of components with minimal capacitive and leakage loading.

8 Claims, 3 Drawing Figures

PROTECTIVE DIODE NETWORK FOR MOS DEVICES

The present invention relates to a protective network for insulated gate field effect devices.

Insulated gate devices and, specifically, insulated gate field effect transistors (IGFETs) are subject to permanent damage if the voltage applied across the insulator of the IGFET exceeds the rupture potential of the insulator. It has also been observed that the transfer characteristics of IGFETs often change even when their gate-to-source regions are stressed by potentials which are considerably below the rupture potential of the insulator. This is undesirable, especially in linear circuits such as differential amplifiers where the transistors forming the differential section must be closely matched. Therefore, protective networks are needed to prevent potential differentials greater than a predetermined level from being applied across the insulator or between selected electrodes of IGFETs.

Known protective networks include back-to-back diodes connected at, and/or between, selected electrodes or nodes for protecting the electrodes or nodes from overvoltages. A problem with these networks is that they increase the number of components, use up chip area, and add capacitance to critical circuit nodes.

The present invention resides, in part in the recognition that where two or more networks having back-to-back diodes are used to protect transistors forming a differential amplifier, some of the diodes in the protective networks may be combined to produce a simple, low component count, low capacitance protective network.

The invention also resides in a protective network for a differential amplifier stage comprised of two insulated gate field effect transistors. The network includes a first region of first conductivity type in which three regions of second conductivity are diffused for forming three diodes having high back impedance. Each one of the three regions is connected to a different one of the gates and a point common to the source regions of the transistors.

In the accompanying drawing, like reference characters denote like components, and:

Figure 1:
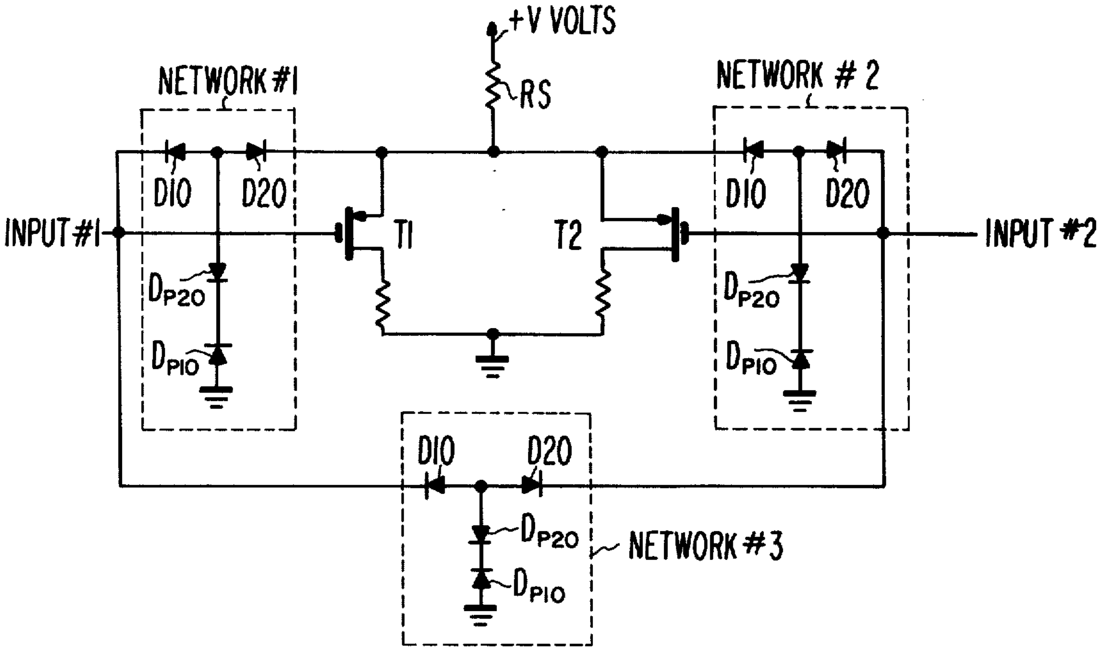
FIG. 1 is a schematic diagram of a circuit known to Applicant which illustrates the problems resolved by the invention.

In FIG. 1, a differential amplifier circuit comprised of transistors T1 and T2 is protected from overvoltages by three, identical protective networks. Each diode network includes two back-to-back diodes (D10 and D20) having a common region with which there is associated a parasitic leakage path. The leakage path includes a forward biased diode, $D_{P20}$, and a reverse biased, leaky diode $D_{P10}$ having a low back impedance. The parasitic leakage path is formed concurrently with the formation of a single protection diode in most bulk silicon integrated circuits suitable for the manufacture of IGFETs for linear circuit applications. Accordingly, two back-to-back diodes are used in each protective network to isolate the leakage path from the electrode(s) or nodes to be protected.

Differentially connected transistors T1 and T2 are connected in common at their source electrodes to one end of resistor Rs. +V volts is applied to the other end of resistor Rs. Network No. 1 is connected between the gate and source electrodes of transistor T1; network No. 2 is connected between the gate and source electrodes of transistor T2; and network No. 3 is connected between the gates of transistors T1 and T2.

Assume that diodes D10 and D20 are identical and that they have a reverse breakdown voltage of $V_B$ volts and a forward voltage drop of $V_{BE}$ volts. Networks No. 1 and No. 2 prevent the potential between the gates and sources of transistors T1 and T2, respectively, from exceeding $|V_B+V_{BE}|$ volts. Network No. 3 limits the maximum potential between the gates of transistors T1 and T2 to $|V_B+V_{BE}|$ volts. In the absence of network No. 3, the potential between the gates could go to $2\times|V_B+V_{BE}|$ volts.

A problem with the addition of these protective networks is that two diodes are connected to the gates of transistors T1 and T2. This adds capacitance to the gates. Also, associated with the diodes there is some leakage even though the diode networks are especially designed to limit the leakage current. In addition, the diode networks increase the number of components and take up space and surface area.

Applicant recognized that the function performed by network No. 3 could be performed by the combination of network No. 1 and network No. 2 if a connection were made between the common (anode) regions of diodes D10 and D20 in networks No. 1 and No. 2. Applicant further recognized that diodes D20 in networks 1 and 2 would then be in parallel and that one of these two diodes could then be eliminated.

In circuits embodying the invention, protection for a differential amplifier is obtained using fewer components with lower capacitive and leakage loading than in the circuit of FIG. 1.

Figure 2:
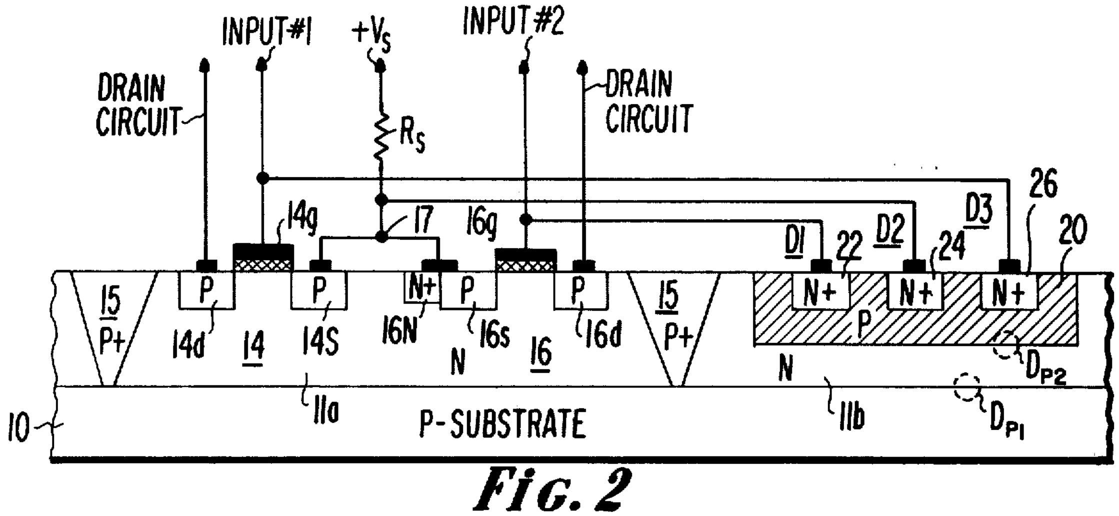
FIG. 2 is a drawing showing a partial cross-section of an integrated circuit embodying the invention.

The structure of FIG. 2 includes a substrate 10 of P-conductivity type on which is formed an epitaxial layer 11 of N-conductivity type. Highly doped regions 15 of P-conductivity type are diffused in the epitaxial layer for isolating portions 11*a* and 11*b* of the N-layer from each other.

Insulated gate field effect transistor 14 is formed by diffusing spaced apart P-conductivity regions 14*s* and 14*d* into portion 11*a* of the N-layer. Overlying the space between regions 14*s* and 14*d* is an oxide layer (shown cross-hatched) over which is formed a gate electrode 14*g*. IGFET 16 is formed by diffusing spaced apart P-conductivity regions 16*s* and 16*d* into portion 11*a*. Overlying the space between regions 16*s* and 16*d* is an oxide layer (shown cross-hatched) over which is formed a gate electrode 16*g*. Regions 14*s* and 16*s*, which are designed to be the source regions of transistors 14 and 16, respectively, are connected in common at node 17. It should be appreciated that, alternatively, the source regions of transistors 14 and 16 could be formed from a single P-region. Highly doped region 16N of N-conductivity is diffused adjacent to region 16*s* and an electrical contact, 18, common to regions 16*s* and 16N completes the connection of local substrate 11*a* to the sources 14*s* and 16*s*.

The protective network for transistors 14 and 16 includes a region 20 of P-conductivity type diffused within region 11*b*. No metal connections need be made to regions 11*b* and 20. P-region 20 may be formed at the same time as, and may extend to the same depth as, the P-regions forming the sources and drains of transistors 14 and 16.

Three highly doped regions, 22, 24 and 26 of N-conductivity type are diffused within region 20 for forming diodes D1, D2 and D3. Metal or other low impedance connections are made between region 22 and gate 16*g* of transistor 16, between region 24 and the sources of transistors 14 and 16, and between region 26 and the gate 14*g* of transistor 14. Regions 22, 24 and 26 function as the cathodes of diodes D1, D2 and D3, respectively, and region 20 functions as the anode of diodes D1, D2 and D3.

Parasitic diodes are present between region 20 and the substrate 10. Regions 10 and 11*b* form a PN junction $D_{P1}$ where region 10 functions as the anode of the diode and region 11*b* functions as the cathode of the diode. Regions 11*b* and 20 form PN junction $D_{P2}$ where region 11*b* functions as the cathode of the diode and region 20 functions as the anode of the diode.

Regions 22, 24 and 26 are more heavily doped than regions 20. But the latter is also highly doped relative to regions 11*b* and 10. Region 10 is the least heavily doped region. As a result, diode $D_{P1}$ is a relatively leaky diode having a low back impedance and a relatively high breakdown voltage. Diodes D1, D2 and D3 have low leakage, high back impedance and relatively low breakdown voltages. In a typical circuit application the breakdown voltage ($V_B$) of diodes D1, D2 and D3 may be designed to be approximately 9 volts. As more fully described below, diodes D1, D2 and D3, while providing overvoltage protection to the circuit to which they are connected, also isolate the leakage path, comprised of diodes $D_{P1}$ and $D_{P2}$, from the circuit which they protect.

Figure 3:
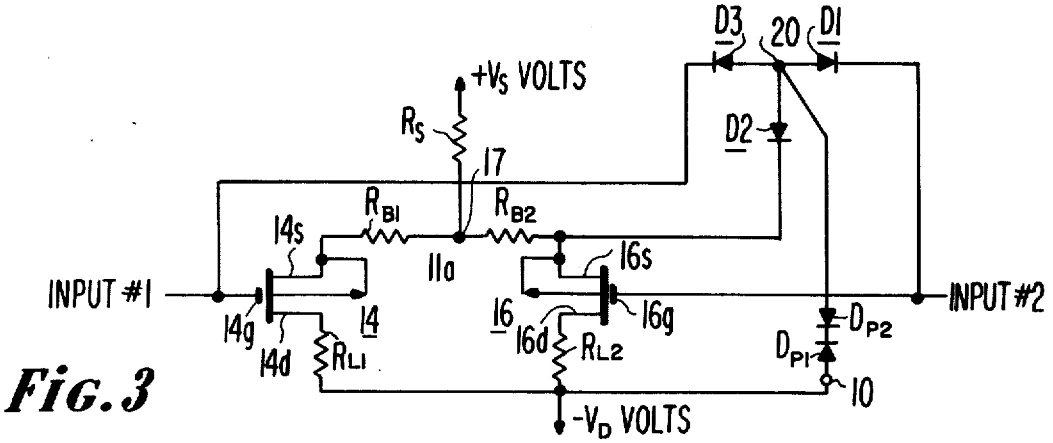
FIG. 3 is a schematic diagram of a circuit which is approximately equivalent to the embodiment of FIG. 2.

The schematic diagram of the FIG. 2 structure together with a few additional components is illustrated in FIG. 3. Transistors 14 and 16 are connected at their gates 14*g* and 16*g*, respectively, to input No. 1 and input No. 2, respectively. Their sources (14*s* and 16*s*) are connected through balancing resistors $R_{B1}$ and $R_{B2}$ to a common point at node 17 to which is connected one end of resistor R*s*. In the discussion to follow the balancing resistors will be assumed to have negligible impedance. The other end of resistor Rs is connected to the most positive point of operating potential $+V_s$ volts. The drains 14*d* and 16*d* of transistors 14 and 16, respectively, are connected by means of resistors $R_{L1}$ and $R_{L2}$, respectively, to the most negative circuit potential $-V_D$ volts.

Diodes D1, D2 and D3 are connected at their cathodes to the gate 16*g* of transistor 16, the source substrate of transistors 14 and 16 and the gate 14*g* of transistor 14, respectively. The anodes of diodes D1, D2 and D3 are common to the anode of parasitic diode $D_{P2}$. The cathode of diode $D_{P2}$ is connected to the cathode of diode $D_{P1}$.

The most negative circuit potential $-V_D$ volts is applied to the anode of diode $D_{P1}$. Consequently, diode $D_{P1}$ is normally reverse biased and diode $D_{P2}$ is forward biased. The potential or signal level applied to the cathodes of diodes D1, D2 or D3 is normally greater than $-V_D$ volts and less than $+V_S$ volts. The protective diodes are, therefore, reverse biased throughout the linear and useful range of operation and isolate the leakage path of diode $D_{P1}$ from affecting the signals at the gates or sources of transistors 14 and 16.

The protective diode network prevents the potential between the gates of the transistors and between the gates and the common source region from exceeding $|V_B+V_{BE}|$ volts, where the diodes are assumed to have equal breakdown (reverse) voltages, $V_B$, and equal forward drops, $V_{BE}$. For example, when the signal at input No. 1 goes highly positive such that the voltage breakdown of diode D3 is exceeded, the potential at input No. 1 is clamped to $V_B$ volts above the potential at region 20 and the potential at region 20 is then one $V_{BE}$ drop above the lowest potential present at either one of node 17 or input No. 2. If the potential applied to the common source region 17 exceeds the $V_B$ of diode D2, then the potential at node 17 becomes clamped to $|V_B+V_{BE}|$ volts above the lowest one of the potential levels present at one of the two gates.

In a symmetrical fashion, if the signal applied to one of the inputs goes highly negative, either the diode connected to the other input or to the source will break down. The potential at the one input is then clamped to $|V_B+V_{BE}|$ volts below the most positive potential present at the source or the other gate. Similarly, if the potential at the source goes highly negative, either diode D1 or D3 will break down to clamp the source potential to $|V_B+V_{BE}|$ volts below the most positive potential present at either gate.

In the range of linear operation of interest, the protective diodes D1, D2 and D3 are normally reverse biased. Also, the potential at the sources of transistors 14 and 16 is, normally, more positive than the potential at their gates.

Recall that diodes D1, D2 and D3 have high back impedance whereas diode $D_{P1}$ has relatively low back impedance and diode $D_{P2}$ is forward biased. Accordingly, with $-V_D$ volts applied to the anode of diode $D_{P1}$, the potential established within region 20 will be close to $-V_D$ volts. Under normal operation the potential at node 17, the source region of the transistors, is more positive than the potential at either gate 14*g* or 16*g*. This causes diode D2 to have a greater potential stress across its junction than diodes D1 or D3. As a result, diode D2 will normally carry, in the reverse direction, the leakage current drawn by the parasitic leakage path. The current through diode D2 causes the potential at region 20 to rise to a level more positive than $-V_D$ volts.

The above may best be understood with the following brief example. Assume: $-V_D$ to be equal to −10 volts and $+V_S$ to be +10 volts, the breakdown voltage ($V_B$) of diodes D1, D2 and D3 to be equal to 9 volts, and their $V_{BE}$ to equal 0.8 volts. Assume also that initially the gates of the transistors are at −2 volts and that the potential at node 17 is at +1 volt. The low back impedance of diode $D_{P1}$ and forward biased diode $D_{P2}$ coupled $-V_D$ volts to region 20. Diodes D1 and D2 having less than 9 volts reverse bias across their junctions operate as high impedance, low leakage devices. However, diode D2 with +1 volt on its cathode and initially assumed −10 volts at its anode is stressed to the breakdown point and the reverse leakage flowing through it increases. This increased leakage current flows through the leakage path comprised of diodes $D_{P1}$ and $D_{P2}$. Note that though diode $D_{P1}$ has a low back impedance relative to diode D1 or D2, it has in fact a high impedance (in the megohm range). Therefore, any increase in the reverse current of diode D2 causes region 20 to rise in potential, until $V_B$ is established across D2. As the signals applied to inputs No. 1 and No. 2 increase, the potential at node 17 increases correspondingly. The potential at node 17 is normally slightly more positive than the potential at the inputs. Diode D2 keeps on supplying a leakage current which keeps on raising the potential of region 20.

The leakage levels under consideration are small. The leakage currents through diodes $D_{P1}$ and $D_{P2}$ may be at most in the microampere range ($10^{-6}$ amps). The equivalent impedance of the leakage path is, therefore in the megohm range and very little current flow through diode D2 is necessary to raise the potential of region 20.

When leakage current flows, it is a significant advantage to have the leakage current for the parasitic network flow through diode D2 rather than diodes D1 or D3. The current into the common source region may be many orders of magnitude greater than the leakage current of the parasitic path. Therefore, some leakage current drawn away from the source region has no perceptible effect on the circuit operation. On the other hand, if the same leakage current were to be drawn from the gates or supplied at the gates, the circuit operation could be significantly and deleteriously affected. To match the extremely high input impedance of the IGFETs, the protective diodes D1, D2 and D3 are designed to have maximum leakage currents, under normal conditions, in the range of nanoamperes.

Therefore, connecting a reverse biased diode (D2) between the common source region (14s, 16s) and the common (anode) region 20, in addition to providing breakdown protection, ensures that the diodes connected to the gate electrodes are held in their low leakage condition.

What is claimed is:

1. The combination comprising:

a substrate of semiconductor material of first conductivity type; a layer of semiconductor material of second conductivity type disposed on said substrate and forming a first PN junction therewith;

first and second field effect transistors, each comprising first and second spaced apart regions of first conductivity type, defining the source and drain regions, respectively, disposed in said layer at a surface thereof, and a gate electrode overlying said surface between said first and second regions; means connecting said transistors in a differential configuration including means connecting the source regions of said first and second transistors to a common point;

means protecting said first and second transistors against overvoltages applied between the gates of said transistors and between the gates and the sources of said transistors comprising: an additional region of first conductivity type disposed within said layer and forming a second PN junction therewith; three spaced apart regions of second conductivity type disposed within said additional region, each of said three spaced apart regions forming a PN junction with said additional region; and means electrically connecting the gate electrode of said first transistor to one of said three regions, means electrically connecting the gate electrode of said second transistor to a second one of said three regions, and means connecting the third one of said three regions to said common point.

2. The combination as claimed in claim 1 wherein said means connecting said transistors in a differential configuration includes an impedance means connected at one end to the source regions of said transistors and at its other end to a first terminal.

3. The combination as claimed in claim 2 wherein said means connecting said transistors in a differential configuration includes impedance means connected between the drain region of one of said transistors and a second terminal.

4. The combination as claimed in claim 3 further including means for applying the same potential to said second terminal and to said substrate and including means for applying a potential between said first and second terminals having a polarity to reverse bias the PN junctions formed by said three regions.

5. The combination as claimed in claim 1 wherein said additional region is isolated from said first and second transistors, and wherein said first and second transistors are connected at their sources to that portion of said layer in which their source and drain regions are disposed.

6. The combination as claimed in claim 1, further including means for applying a potential between said substrate and the sources of said transistors having a polarity to reverse bias said first PN junction and the PN junctions formed by said three regions.

7. The combination comprising:

first and second insulated-gate field-effect transistors, each transistor having a gate, a source and a drain;

means connecting the sources of said transistors to a first node;

a first terminal for the application thereto of an operating potential;

impedance means connected between said first node and said first terminal;

first and second input terminals connected to the gates of said first and second transistors, respectively;

first, second and third diodes, each diode having an anode region and a cathode region;

the same one of said anode and cathode regions of said three diodes being connected in common; and the other one of said anode and cathode region of said first, second and third diodes being connected to the gate of said first transistor, the gate of said second tansistor and to said first node, respectively.

8. In an integrated circuit including two insulated gate field effect transistors (IGFETS) connected in common at their source electrodes for forming a differentially connected amplifier stage, means for preventing potentials greater than a predetermined level from developing between the gates of the transistors and between the gates and the sources of the transistors comprising:

a first region of first conductivity type formed within said integrated circuit;

three regions of second conductivity type formed within said first region and forming three PN junctions therewith;

means connecting one of said three regions to the gate of one of said IGFETS;

means connecting a second one of said three regions to the gate of the other one of said IGFETS; and means connecting the third one of said three regions to the source electrodes of said IGFETS.

* * * * *